(12) United States Patent
Lee et al.

(10) Patent No.: US 9,631,275 B2
(45) Date of Patent: Apr. 25, 2017

(54) DEVICE FOR FORMING A LAYER

(71) Applicant: LG CHEM, LTD., Seoul (KR)

(72) Inventors: Seong Hwan Lee, Daejeon (KR); Dong Ryul Kim, Daejeon (KR); Jang Yeon Hwang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 12 days.

(21) Appl. No.: 14/429,669

(22) PCT Filed: Dec. 2, 2013

(86) PCT No.: PCT/KR2013/011097
§ 371 (c)(1),
(2) Date: Mar. 19, 2015

(87) PCT Pub. No.: WO2014/084698
PCT Pub. Date: Jun. 5, 2014

(65) Prior Publication Data
US 2015/0232989 A1     Aug. 20, 2015

(30) Foreign Application Priority Data

Nov. 30, 2012 (KR) .................. 10-2012-0138318
Dec. 2, 2013 (KR) .................. 10-2013-0148683

(51) Int. Cl.
*C23C 16/00*     (2006.01)
*C23C 16/455*    (2006.01)
*C23C 16/458*    (2006.01)
*C23C 16/54*     (2006.01)

(52) U.S. Cl.
CPC ...... *C23C 16/45544* (2013.01); *C23C 16/458* (2013.01); *C23C 16/45548* (2013.01); *C23C 16/45578* (2013.01); *C23C 16/545* (2013.01)

(58) Field of Classification Search
CPC .................. C23C 16/45548; C23C 16/458
USPC ....................................... 118/719, 50
See application file for complete search history.

(56) References Cited

U.S. PATENT DOCUMENTS

| | | |
|---|---|---|
| 4,692,233 A | 9/1987 | Casey |
| 2002/0170496 A1 | 11/2002 | Ha et al. |
| 2004/0201027 A1 | 10/2004 | Ghosh |
| 2007/0281089 A1 | 12/2007 | Heller et al. |
| 2011/0139072 A1* | 6/2011 | Tamagaki ............... C23C 14/24 118/718 |
| 2011/0189806 A1* | 8/2011 | Cao .................. C23C 14/086 438/62 |
| 2011/0256323 A1 | 10/2011 | Dickey et al. |
| 2012/0021128 A1 | 1/2012 | Dickey |
| 2014/0020627 A1 | 1/2014 | Kano et al. |

FOREIGN PATENT DOCUMENTS

| | | |
|---|---|---|
| CN | 101406108 A | 4/2009 |
| EP | 2692899 A1 | 2/2014 |
| JP | 2004-319484 A | 11/2004 |

(Continued)

*Primary Examiner* — Yewebdar Tadesse
(74) *Attorney, Agent, or Firm* — Dentons US LLP

(57) ABSTRACT

Provided are a device for forming a layer and an atomic layer deposition (ALD) method or a method for forming a layer. The present application provides a device for forming a layer which may effectively form a desired layer by a continuous ALD, and an ALD method or a method for forming a layer by using the device for forming a layer.

10 Claims, 11 Drawing Sheets

(56) References Cited

FOREIGN PATENT DOCUMENTS

| | | | |
|---|---|---|---|
| JP | 2009-270145 A | 11/2009 |
| KR | 10-2008-0106555 A | 12/2008 |
| KR | 10-2009-0043474 A | 5/2009 |
| WO | 2011/156484 A2 | 12/2011 |
| WO | 2012012744 A2 | 1/2012 |
| WO | 2012/133541 A1 | 10/2012 |

* cited by examiner

DEVICE FOR FORMING A LAYER

This application is a National Stage Entry of International Application No. PCT/KR2013/011097, filed Dec. 2, 2013, and claims the benefit of Korean Application Nos. 10-2012-0138318, filed on Nov. 30, 2012, and 10-2013-0148683, filed on Dec. 2, 2013, all of which are hereby incorporated by reference in their entirety for all purposes as if fully set forth herein

TECHNICAL FIELD

The present application relates to a device for forming a layer and a method for forming a layer.

BACKGROUND

A technology for forming various kinds of layers may be required in various fields, for example, forming of a conformal coating such as a barrier layer, a flexible display coating required in an electroluminescent display, a liquid crystal display (LCD), electrophoresis, or the like, radio frequency identification (RFID), microelectromechanical systems (MEMS), optical coatings, electronic components on a flexible substrate, layers on the flexible substrate, electrochromics, photoelectromotive force, and the like.

PRIOR ART DOCUMENT

Patent document 1: U.S. Patent Application Publication No. 2002-0170496
Patent document 2: U.S. Pat. No. 4,692,233

DETAILED DESCRIPTION

Technical Object

The present application provides a device for forming a layer and a method for forming a layer.

Technical Solution

The present application provides a device for forming a layer comprising a transferring system comprising at least one guide roll installed so as to transfer a substrate; and a first treating region installed so as to form a precursor layer on a surface of the substrate that is transferred.

The treating region comprises a first chamber and a second chamber disposed at an upper or lower side of the first chamber, and a through portion, through which the substrate can be introduced into the second chamber from a lower or upper side of the first chamber, is formed in the first chamber. The guide rolls are in each of the first and second chambers, respectively and are installed so as to form a path, by which the substrate can pass through the first chamber and then the second chamber through the through portion.

Technical Effects

According to the present application, there are provided the device for forming a layer which may transfer the substrate, e.g., a flexible substrate such as a plastic film and a fibrous or metallic web or film and may form the layer on the substrate, and the method for forming a layer using the device. Using the device, various kinds of the precursor layer may be formed on the substrate.

ILLUSTRATIVE EMBODIMENTS

Figure 1:
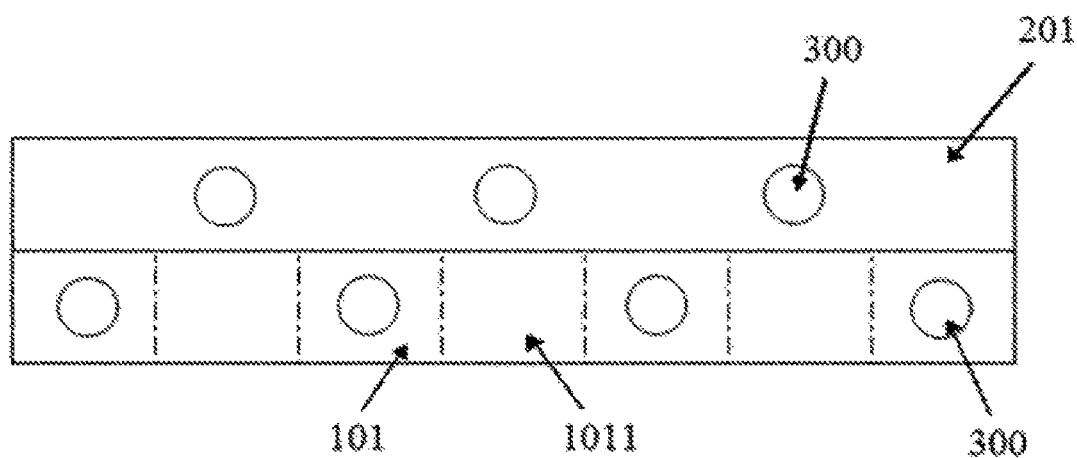
FIGS. 1 to 6 show illustrative embodiments of the treating regions or devices for forming a layer.

According to an aspect of the present application, there is provided a device for forming a layer which is configured to form a layer on a substrate while the substrate is transferred. The apparatus may be a so-called roll-to-toll device for forming a layer.

The device for forming a layer may include a transferring system including one or more guide rolls installed to transfer a substrate, and a first treating region installed to form a precursor layer on a surface of the substrate while the substrate is transferred.

The first treating region may include a first chamber and a second chamber disposed at an upper or lower portion of the first chamber, and the first chamber may have a through portion through which the substrate is introduced from the upper or lower portion of the first chamber to the second chamber. In one embodiment, the second chamber may be disposed to be in contact with the upper or lower portion of the first chamber.

The one or more guide rolls may be provided in each of the first and second chambers and also may form a path to enable the substrate to pass through the first chamber and then the second chamber through the through portion. In this process, the substrate introduced into the second chamber through the through portion may be discharged to an outside of the second chamber through the same through portion.

The first or second chamber may have a passage, e.g., a flow restricting passage to be described later, and the substrate may be introduced into or discharged from the first or second chamber through the passage.

In one embodiment, the device for forming a layer may be an atomic layer deposition (ALD) apparatus, e.g., a roll-to-toll ADL apparatus which forms the layer in an ALD manner.

According to another aspect of the present application, there is provided a method for forming a layer, for example, a method for forming a layer using the device for forming a layer.

Detailed Description of Illustrative Embodiments

A device for forming a layer of the present application may include a transferring system, and at least one treating region (hereinafter, may be called a first treating region in order to be distinguished from another treating region to be described later) which may form a layer on a substrate transferred by the transferring system.

The transferring system may be formed to transfer the substrate and may have any structures which enable transferring of the substrate. In one embodiment, the device for forming a layer may be a so-called roll-to-roll apparatus. In this case, the transferring system may include one or more guide rolls. The guide rolls of the transferring system may form a path which enables the substrate to pass through the treating region.

The first treating region is a region in which the substrate is introduced by the transferring system and a treatment for forming a layer is carried out. As described later, when a layer of a precursor is formed on the substrate in the treating region, the treating region may be formed to receive the precursor. The precursor as a term used in the specification may include all kinds of materials which may form the layer, and each of which itself may form the layer, or each of which may be applied to a surface of the substrate first and then may form the layer through its own reaction or a reaction with other materials. A state of the precursor is not particularly limited, and may be a gas, a liquid, or a solid (for example, a fine powder).

A mechanism for forming the precursor layer in the treating region is not particularly limited. For embodiment, a method of forming the layer, such as an atomic layer deposition (ALD), a CVD, and a sputtering, is already known variously. The mechanism for forming the layer in the treating region may be selected properly according to applied one out of the above methods.

The treating region may include a first chamber and a second chamber, and the precursor may be received in each chamber. A kind of the precursor received in each of the first and second chambers may be the same as or different from each other.

Figure 2:
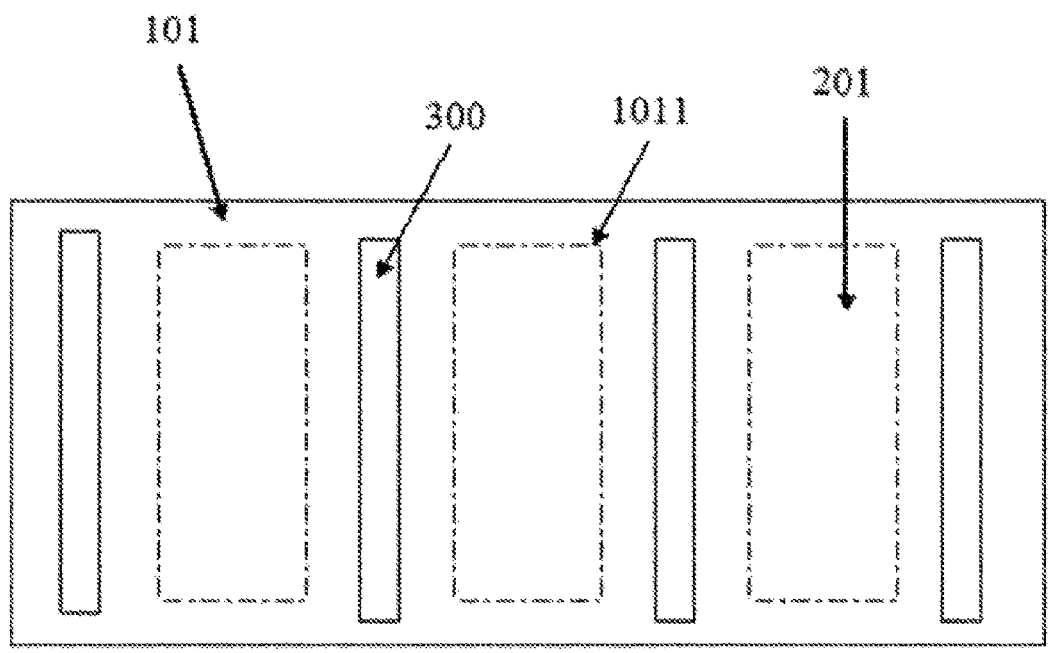

In the treating region, the second chamber may be arranged at an upper or lower portion of the first chamber. FIG. 1 is a view exemplarily illustrating a state in which first and second chambers 101 and 201 are stacked. In FIG. 1, the first and second chambers 101 and 201 are in contacted with each other. However, the first and second chambers 101 and 201 may be spaced apart from each other in a predetermined distance. FIG. 1 illustrates exemplarily the treating region having a structure of FIG. 2 when seeing from a side of the first chamber 101.

Figure 3:
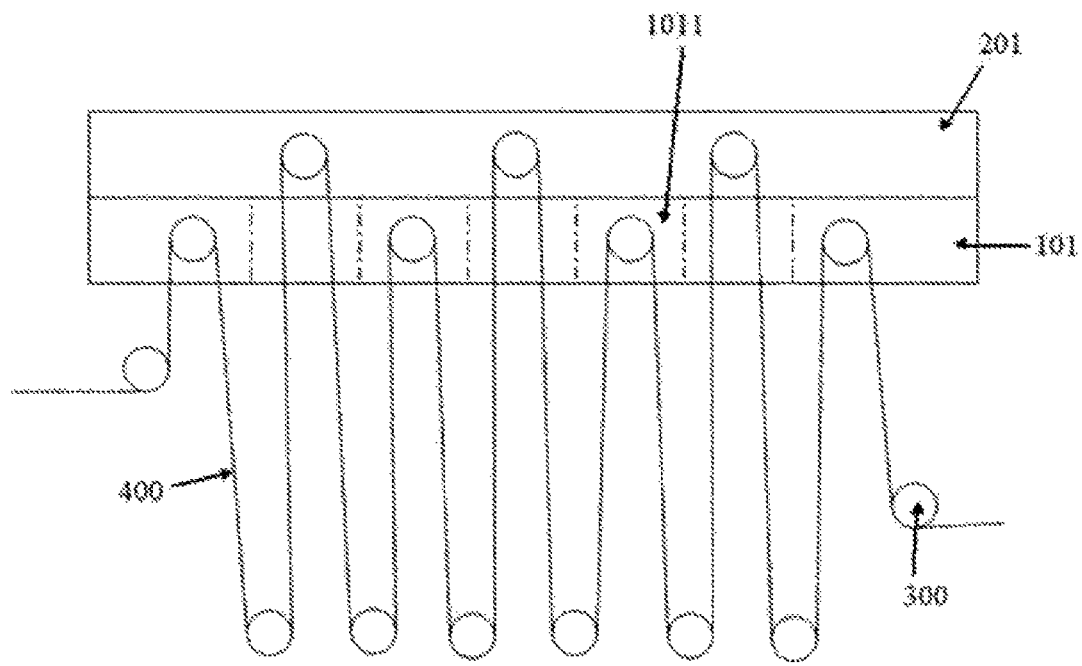

As illustrated in the drawing, a through portion 1011 is formed in the first chamber 101, and guide rolls 300 may form a path to enable the substrate to pass through the first chamber 101, to be introduced into the second chamber 201 through the through portion 1011, and then to be discharged. FIG. 3 is a view exemplarily illustrating the guide rolls 300 which form a path to enable a substrate 400 to be moved in the above-mentioned manner in the structure of FIG. 1.

If necessary, the device for forming a layer may further include a second treating region in addition to the first treating region. The second treating region may be a region which forms the precursor layer on the substrate, like in the first treating region, or performs a purging operation with respect to the substrate using an inert gas or the like. For embodiment, the second treating region may be formed into a general chamber. In this case, the guide rolls may form a path to enable the substrate passing through the first chamber to pass through the second treating region and then the second chamber through the through portion of the first chamber.

Figure 4:
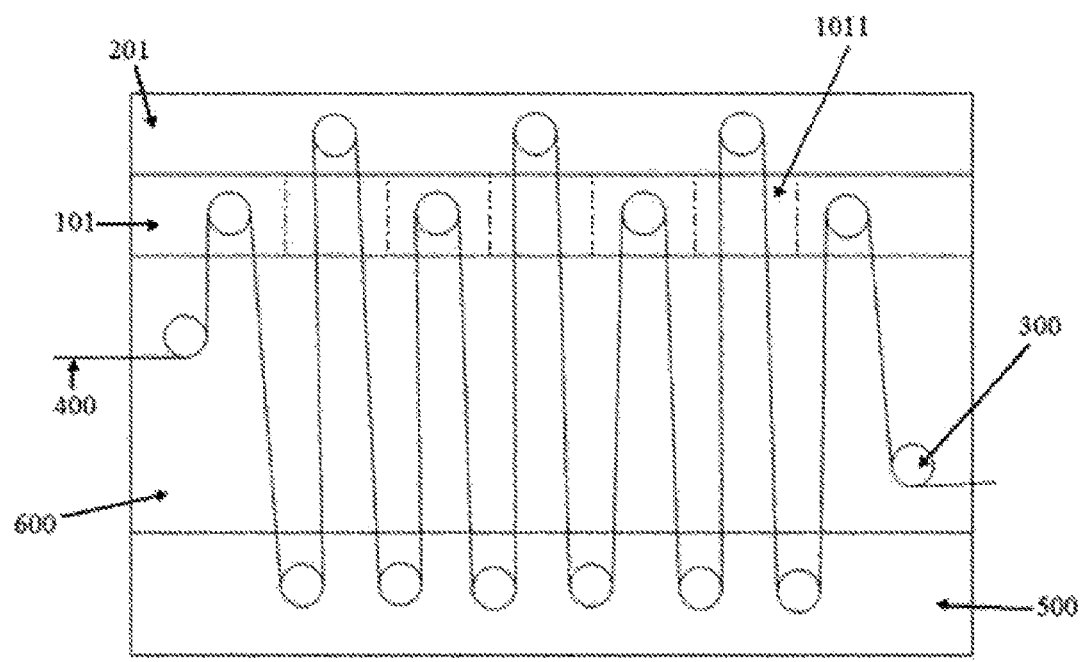

FIG. 4 is a view illustrating an embodiment in which a second treating region 500 is further included. The guide rolls 300 form the path to enable the substrate 400 passing through the first chamber 101 to pass through the second treating region 500 and then the second chamber 201 through the through portion 1011 of the first chamber 101. In this case, the guide rolls 300 may be provided in the second treating region 500.

In the device for forming a layer, the first and second treating regions may be partitioned by another region (hereinafter, called a third treating region). The third treating region may be a region which forms the precursor layer on the substrate, like in the first treating region, or performs a purging operation with respect to the substrate using an inert gas or the like. If all of the first, second, and third treating regions form the precursor layer, a kind of the precursor in each treating region may be the same as or different from each other. In this case, the guide rolls of the transferring system may be formed to enable the substrate to pass through the first chamber, the third treating region, the second treating region, and the second chamber, in turn, or the second chamber, the third treating region, the second treating region, and the first chamber, in turn.

FIG. 4 shows an illustrative embodiment in which in which the first treating regions 101 and 201 and the second treating region 500 are divided by a third treating region 600.

As illustrated in FIG. 4, the guide rolls 300 of the transferring system may be formed to enable the substrate 400 to pass through the first chamber 101, the third treating region 600, the second treating region 500, and the second chamber 201, in turn, or the second chamber 201, the third treating region 600, the second treating region 500, and the first chamber 101, in turn.

In the above-mentioned structure, the second chamber may include a convex portion which is formed in a direction of the first chamber. In this case, the convex portion may be inserted into the through portion of the first chamber, but is not limited thereto. Further, in this structure, the guide rolls of the second chamber may be provided at the convex portion of the second chamber, but may not be provided at the convex portion.

Figure 5:
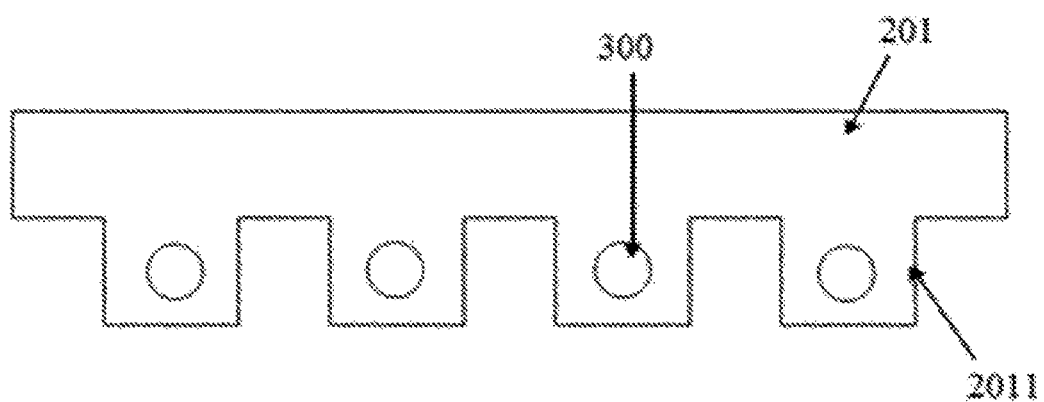
Figure 6:
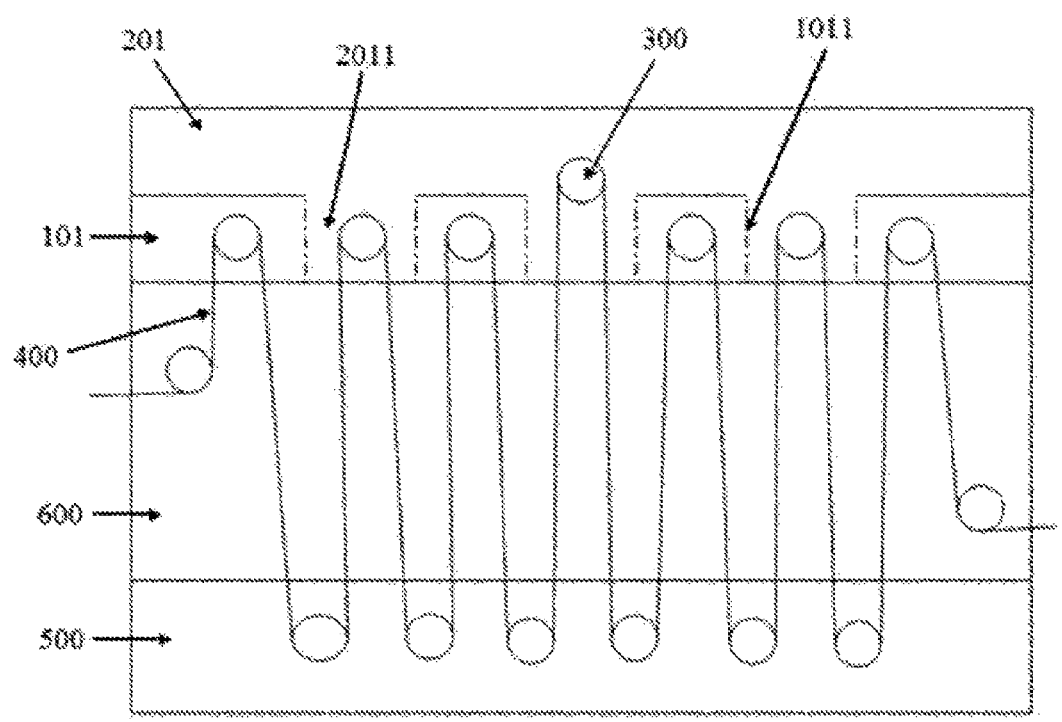

FIG. 5 is a view exemplarily illustrating the second chamber 201 having a convex portion 2011, and FIG. 6 is a view illustrating an embodiment which is the same type as the device for forming a layer of FIG. 4, but uses a chamber having the convex portion 2011 as the second chamber 201. Thus, the description of FIG. 4 may be applied equally, except that the convex portion 2011 is formed at the second chamber 201.

In this structure, the through portion of the first chamber may have a size to enclose an outer surface of the convex portion of the second chamber, when the convex portion is inserted into the through portion. In this case, the through portion may be formed to have the same size as the convex portion, or have a larger size than the convex portion.

In this structure as described above, at least two chambers such as the first and second chambers are alternately arranged, and one chamber such as the first chamber is connected through both side portions thereof, and the other chamber such as the second chamber is connected through an upper portion thereof. Due to this structure, it is possible to supply more various kinds of precursors in a layer forming process.

This structure may be applied variously and thus used for supplying more various kinds of precursors. For embodiment, in the structures of FIGS. 1 to 6, if the second chamber 201 is horizontally divided into two or more parts, or two or more second chambers 201 having the same shape are disposed at an upper or lower portion of the first chamber 101, it is possible to supply the more various kinds of precursors.

In another embodiment, the second treating region 500 illustrated in the drawings may also use two chambers and thus may be embodied like in the first treating region.

For embodiment, like in the first treating region, the second treating region may include a third chamber and a fourth chamber disposed at an upper or lower portion of the third chamber, and the third chamber may have a through portion through which the substrate may be introduced into the fourth chamber from the upper or lower portion of the third chamber. In this case, the guide rolls may form a path to enable the substrate passing through the first chamber to pass through the third chamber, the second chamber through the through portion of the first chamber, and then the fourth chamber through the through portion of the third chamber.

Even in this case, as described above, the first and second treating regions may be partitioned by the third treating region, for example, a purging chamber which is formed to receive the inert gas.

The descriptions of the first and second chambers may be applied equally to the third and fourth chambers.

At least one or more passages are formed in each of the first and second chambers of the first treating region, the third and fourth chambers of the second treating region, and the third treating region. The substrate transferred by the transferring system may be introduced into or discharged from each region or chamber through the passage. In one embodiment, the passage may be a flow restricting passage. The flow-restricting passage as a term used in the specification may include all kinds of passages through which the substrate may be moved, but a material, which is undesirable to be leaked to an outside, for example, the precursor is prevented from being leaked. For embodiment, the each region may be installed to deposit the precursor on the surface of the substrate introduced through the flow restricting passage and thus form a layer.

At least one guide roll of the transferring system may be provided in each of the first and second chambers, and also may be provided in the second treating region, e.g., each of the third and fourth chambers. The guide roll may form a path which enables the substrate to pass at least once through the each region or chamber through the passage, e.g., the flow-restricting passage.

In the device for forming a layer, at least one of the guide rolls provided in the each region or chamber may be a precursor supplying roll which is installed to supply the precursor toward the substrate. For embodiment, if the supplying roll is disposed in the first chamber, a first precursor may be supplied to the substrate by the supplying roll, while the substrate passes through the first chamber, and a first precursor layer, e.g., a first monolayer may be formed. If the supplying roll is disposed in the second chamber, a second precursor layer, e.g., a second monolayer may be formed on the surface of the substrate, while the substrate passes through the second chamber. The supplying roll may be provided in both of the first and second chambers. Further, in a region in which the supplying roll is not provided, another well-known means for supplying the precursor to the corresponding region may be provided. This manner may be proper to, for example, the ALD, and a desired layer may be formed on the substrate through a process in which the first and second monolayers or additional another monolayers are repeatedly formed on the substrate by the supplying roll or the other means as described above. The first and second precursors may be the same or different kinds from each other, and if necessary, the process of forming the first and second monolayers may be repeated multiple times in order to achieve a desired thickness. Further, in the second or third treating region of the device for forming a layer, a third monolayer is formed by a third precursor, or a purging operation is carried out by an inert gas.

In the device for forming a layer, the transferring system may further include an inputting means for supplying the substrate to the device for forming a layer. The transferring system may further include a collecting means for collecting a treated substrate. A kind of each of the inputting means and the collecting means is not particularly limited. For embodiment, the inputting means may be an unwinding roll which unwinds and supplies the substrate wound in a roll type, and the collecting means may be a rewinding roll which rewinds and collects the substrate.

At least one of the guide rolls of the transferring system may be the precursor supplying roll (hereinafter, may be simply called the supplying roll) which is installed to supply the precursor toward the substrate, while the substrate is transferred.

That is, a precursor supplying means for supplying the precursor may be provided at the guide roll. As described later, the precursor supplying roll may have a structure in which an end thereof has a larger diameter than a central portion thereof, or a structure in which the central portion is not provided. In these structures, a position of the precursor supplying means is not particularly limited. For embodiment, the precursor supplying means may be disposed at the central portion so that the precursor is supplied from the central portion, or may be disposed at an inner side surface of the end.

In one embodiment, the supplying roll may include the both ends and the central portion, and the both ends may be installed to be in contact with and transfer the substrate, and the central portion may have a smaller diameter than the both ends or may not exist so as not to be in contact with the substrate during a transferring process of the substrate.

Figure 7:
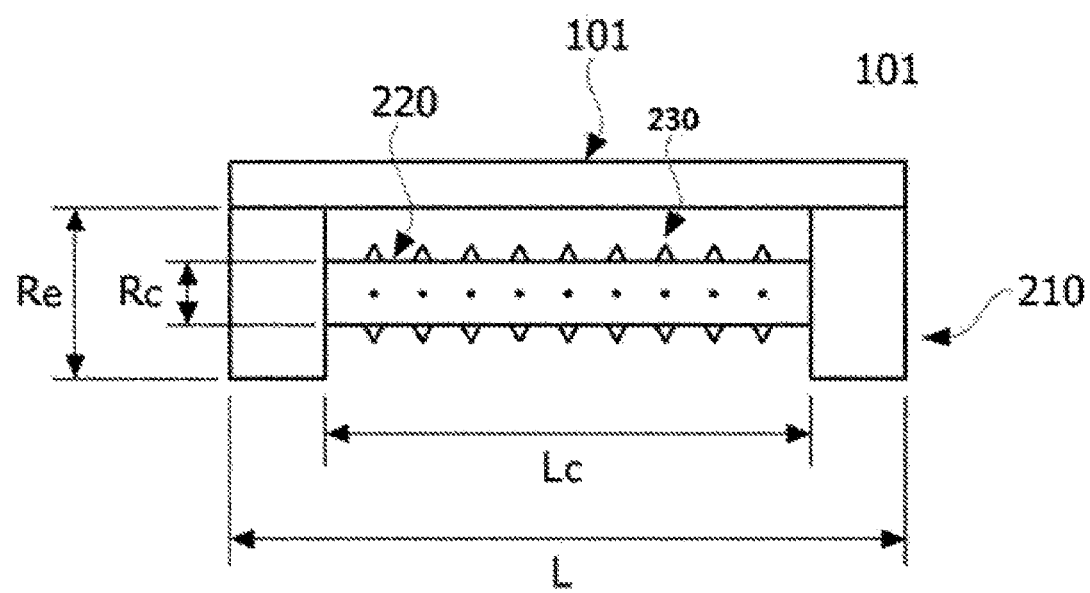
FIGS. 7 to 11 show illustrative embodiments of the precursor supplying rolls.

FIG. 7 is a view exemplarily illustrating a state in which the guide roll is used as the supplying roll. As illustrated in the drawing, the supplying roll may include both ends 210 which are in contact with a substrate 101, and a central portion 220 which is not in contact with the substrate 101. In the supplying roll, a ratio Rc/Re of a diameter Rc of the central portion 220 to a diameter Re of each of the ends 210 is not particularly limited, but may be controlled to enable the substrate 101 to be properly transferred and also to secure a sufficient distance for efficiently forming a monolayer on the substrate 101 with the supplied precursor. For embodiment, the ratio Rc/Re may be 0.9 or less. In the structure in which the central portion does not exist, the ratio Rc/Re is 0.

A ratio Lc/L of a length Lc of the central portion 220 or a distance Lc between the both ends 210, in a case that there is not the central portion 220, to a length L of the supplying roll, which is measured in a direction perpendicular to the transferring direction of the substrate 101, is not particularly limited, either, as long as the ends 210 may be secured so as to properly fix the substrate during the transferring process. For embodiment, the ratio Lc/L may be 0.7 to 0.9.

When the precursor is a liquid or a gas, a spraying orifice 230 as the supplying means may be provided at the central portion 220 of the supplying roll so as to spray the precursor to the substrate 101, as illustrated in FIG. 7. For embodiment, the precursor may be injected through a side surface of the supplying roll and then sprayed to the substrate 101 through the spraying orifice 230. Although not illustrated in the drawings, for example, the spraying orifice 230 may be formed at an inner side surface of each of the ends 210, i.e., a side surface of each of the ends 210 faced to the central portion 220.

The spraying orifice 230 of the supplying roll may be formed in a well-known manner without any limitation, and, for example, may be formed into a spraying nozzle or the like. For embodiment, the spraying orifice 230 may be installed at the central portion 220 of the supplying roll, as illustrated in FIG. 7, or at the inner side surface of each of the ends 210, although not illustrated in the drawings. In FIG. 7, the spraying orifice 230 has a protruding structure, but may have a depressed structure. The number of the spraying orifices 230 may be properly controlled according to a length of the supplying roll and a surface area to be treated.

A guide roll which is not the supplying roll may have the same structure as the supplying roll, except that the spraying orifice 230 is not provided. Further, the guide roll of the device for forming a layer may not be the supplying roll, and all of the guide rolls may not be the supplying rolls. The structure of the supplying roll described in the specification may be also applied to the guide roll or the inputting and collecting means, except the installation of the spraying orifice.

In one embodiment, a protruding portion may be provided at each of the ends of the supplying roll in order to fix the substrate during a transferring process of the substrate. Since the substrate is fixed by the protruding portion during the transferring process, the substrate may be prevented from being separated or slid. In the structure in which only the both ends of the supplying roll are provided without the central portion, the precursor supplying means may be formed at one of the two inner side surfaces of the both ends or formed at both of them to be faced with each other.

For embodiment, the both ends of the supplying roll may be formed to fix the substrate, while applying a tensile force to the substrate in one direction within an angular range of about 70° to 110° with respect to a transferring direction of the substrate, e.g., a vertical direction during the transferring process of the substrate. For embodiment, the ends may be formed to be movable while tensing the substrate in the one direction within the angular range of 70° to 110° with respect to the transferring direction of the substrate, e.g., the vertical direction during the transferring process of the substrate. In another embodiment, the ends or patterns of the protruding portions provided at the ends may be formed so as to transfer the substrate and also tense the substrate at the same time.

FIGS. 8 to 11 are views exemplarily illustrating the above mentioned structures.

Figure 8:
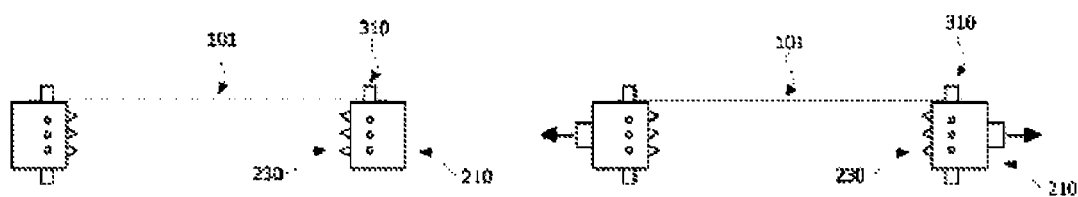

As illustrated in FIG. 8, the supplying roll may have the structure having only the both ends 210. In this structure, the substrate 101 is fixed to protruding portions 310 of the both ends 210, and the both ends 210 are horizontally moved, and thus the substrate 101 may be transferred while being tensed.

Figure 9:
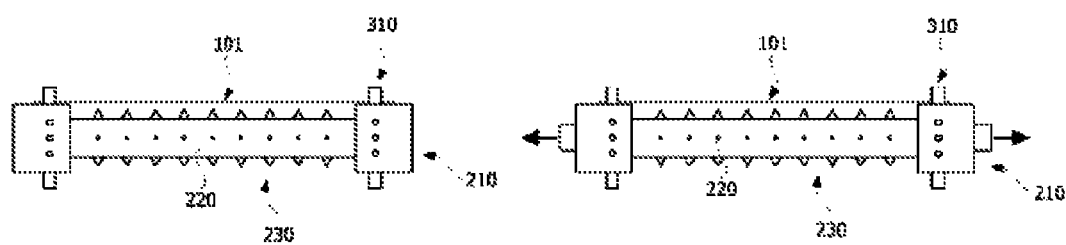

The structure in FIG. 8 may be applied to a supplying roll having the central portion 220, as illustrated in FIG. 9.

Figure 10:
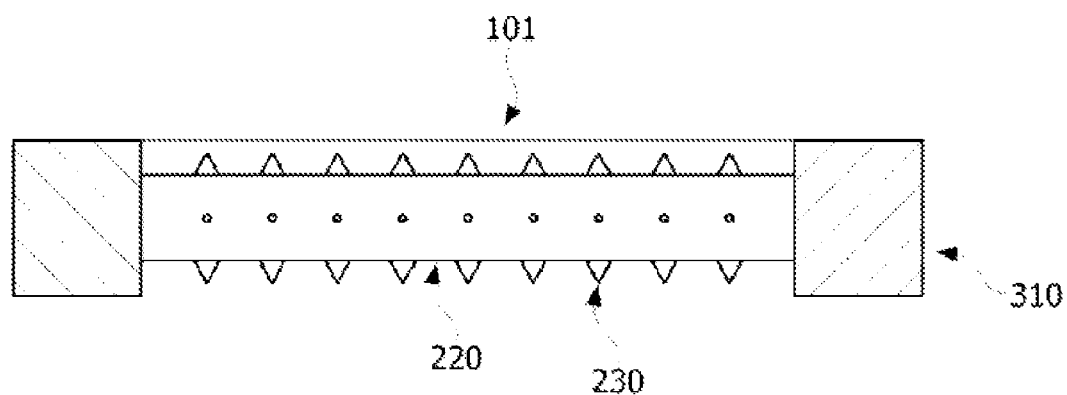
Figure 11:
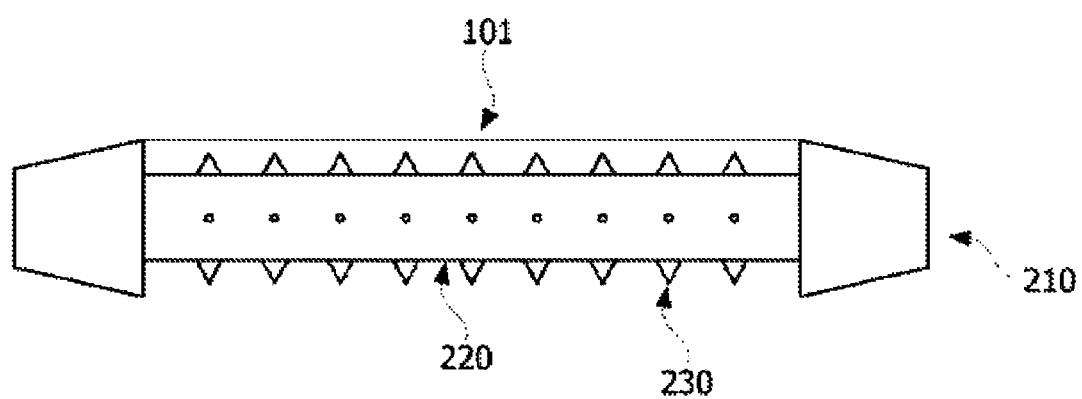

FIG. 10 is a view illustrating another type which may transfer the substrate 101 while applying the tensile force to the substrate 101. As illustrated in FIG. 11, the above-mentioned structure may be embodied by forming the protruding portion 310 into a predetermined pattern. In this case, the pattern of the protruding portion 310 is not particularly limited. For embodiment, the protruding pattern may have a line shape which forms an angle larger than 0° and less than 90° with respect to the transferring direction of the substrate. For embodiment, this shape may be a comb shape as illustrated in FIG. 10. Due to this shape, it is possible to embody the structure which may transfer the substrate 101 while applying the tensile force to the substrate 101.

FIG. 11 is a view illustrating yet another type of the supplying roll. As illustrated in FIG. 11, even when each of the both ends 210 has a tapered shape, it is possible to embody the structure which may transfer the substrate 101 while applying the tensile force to the substrate 101. This structure may make an effect in which the both ends 210 pull the substrate 101 in both directions during the transferring process of the substrate 101.

Until now, specific types of the guide rolls which may be included in the device for forming a layer have been described. However, the type of the device for forming a layer is not limited thereto, and the device for forming a layer may be also embodied by a general roll, instead of the specific type of rolls.

The transferring system of the device for forming a layer, for example, the guide rolls may be installed to enable the substrate to pass multiple times through the first and second chambers. If there is another region such as the second treating region and the third treating region, the transferring system, e.g., the guide rolls may be installed to enable the substrate to pass multiple times through the first and second chambers via the other region every time.

The transferring system may include a plurality of first guide rolls provided in the first chamber and a plurality of second guide rolls provided in the second chamber. At least a part of the first guide rolls may be formed to change the path of the substrate toward another region, and at least a part of the second guide rolls may be formed to change the path of the substrate toward another region.

In the device for forming a layer, the substrate passes through each region by the transferring system and, in the corresponding region, the precursor may be deposited thereon so as to form the monolayer, or the purging operation may be performed. The precursor may be supplied by the above-mentioned precursor supplying roll or the other supplying means. The other supplying means may include a precursor source installed inside or outside each region, and may further include a pipe, a pump, a valve, a tank, an exhausting means, and another necessary well-known means.

In the device for forming a layer, each chamber or region may control its internal pressure through an exhausting operation by the exhausting means or an induction pressure of the precursor or the inert gas. The chamber may interface with other processing module or equipment for controlling an operation or the like.

In the device for forming a layer, it is necessary to restrict the precursor in each region from being moved into other regions in order to prevent an undesirable reaction caused by mixing the non-deposited precursors on the substrate with a gas in other regions, for example, a non-ALD reaction. Thus, the regions may be connected to each other through the flow restricting passage, or may be adapted to enable the internal pressure to be further controlled. A method of forming the flow restricting passage is not particularly limited, and a well-known method may be applied. For embodiment, each passage may be a slit which is slightly thicker and wider than a thickness and width of the substrate passing through the passage. The passage may be formed to allow only a very small clearance when the substrate passes through the passage but enable the substrate to pass through the passage without any scratches from each surface of the passage. For embodiment, the clearance may be defined within an extent between a few microns and a few millimeters. Further, the passage may be formed to include an elongated tunnel through which the substrate may pass, and if necessary, may further include a wiper for further limiting a flow of gas through the passage. Also, the passage may be an extended long and narrow passage.

In order to prevent the mixing of the precursor, a pressure difference may be formed between the regions. For embodiment, when each treating region is divided by another region, e.g., the third treating region or the like, the mixing of the precursor may be prevented by injecting the inert gas into the third treating region with a larger pressure than that in the treating region. For embodiment, the pressure may be controlled by throttling an exhausting flow of the gas or manually exhausting the gas. In another embodiment, the pressure difference may be formed by performing a pumping operation in the corresponding region using the pump or another sucking source. For embodiment, the pump may be connected with all of the regions and then controlled to produce the pressure difference by regulating the pressure in each region. The movement of the precursor may be prevented by controlling a relative flow rate and a pumping speed of the gas using a flow control valve or another flow control device. Further, it is possible to assist maintenance of the desired pressure difference by controlling a gas injection speed and an exhaust flow rate.

Furthermore, the present application relates to a method for forming a layer. For embodiment, the method for forming a layer may be the ALD. For embodiment, this method may be carried out using the above-mentioned device for forming a layer. For embodiment, the method for forming a layer may include allowing the substrate to pass through the first chamber using the guide rolls of the transferring system and forming a first precursor layer thereon, and allowing again the substrate to pass through the second chamber through the through portion of the first chamber and forming a second precursor layer thereon. This process may be repeated twice or more in order to obtain a desired thickness of the layer, and if necessary, one or more another regions may be provided, as described above, so as to perform the purging operation between the processes of forming the first and second monolayers, or form a third monolayer made of a different material from those of the first and second monolayers.

A kind of the substrate used in the method for forming a layer is not particularly limited, and may be formed of, for example, glass, a plastic film, a metallic web, a fibrous film, or the like. Further, a kind of the layer formed on the substrate by the method for forming a layer may include all of well-known layers formed by the ALD or predicted layers to be formed by the ALD, for example, a barrier layer, a conductive layer, a dielectric layer, an insulating layer, an emissive layer, an electron transport layer, an electron injection layer, a hole injection layer, a hole transport layer, or the like.

Also, a kind of the precursor used for forming the layers is not particularly limited and, for example, may include all of well-known kinds which may be applied to the ALD and may form the above-mentioned kinds of layers.

What is claimed is:
1. A device for forming a layer, comprising:
a transferring system comprising a plurality of guide rolls installed so as to transfer a substrate; and
a first treating region installed so as to form a precursor layer on a surface of the substrate that is transferred,
wherein the treating region comprises a first chamber and a second chamber disposed at an upper or lower side of the first chamber, wherein a through portion, through which the substrate can be introduced into the second chamber from a lower or upper side of the first chamber, is formed in the first chamber, and wherein the guide rolls are in each of the first and second chambers, respectively and are installed so as to form a path, by which the substrate can pass through the first chamber and then the second chamber through the through portion;
wherein the second chamber comprises a convex portion which is formed in a direction toward the first chamber, and the convex portion of the second chamber is inserted into the through portion of the first chamber.

2. The device according to claim 1, which is installed so as to form a layer by an atomic layer deposition.

3. The device according to claim 1, wherein the second chamber is in a lower or upper side of the first chamber and is in contact with the first chamber.

4. The device according to claim 3, wherein the through portion of the first chamber has a size to surround an outer surface of the convex portion to be inserted of the second chamber.

5. The device according to claim 1, further comprising a second treating region installed so as to form a precursor layer on the substrate being transferred, or perform a purging operation using an inert gas.

6. The device according to claim 5, wherein the guide rolls are installed so as to form a path, through which the substrate can pass through the first chamber, and then pass through the second treating region and then pass through the second chamber through the through portion of the first chamber.

7. The device according to claim 5, wherein the first and second treating regions are divided by a third treating region installed so as to form a precursor layer on the substrate or perform the purging operation using the inert gas.

8. The device according to claim 7, wherein the transferring system is installed so as for the substrate to be passed through the first chamber, the third treating region, the second treating region, and the second chamber in the above order, or to be passed through the second chamber, the third treating region, the second treating region, and the first chamber in the above order.

9. The device according to claim 5, wherein the second treating region comprises a third chamber and a fourth chamber at an upper or lower portion of the third chamber, and the third chamber has a through portion through which the substrate can be introduced into the fourth chamber from the upper or lower portion of the third chamber.

10. The device according to claim 9, wherein the guide rolls are installed so as to form a path, through which the substrate can pass through the first chamber and then pass through the third chamber and then pass through the second chamber through the through portion of the first chamber and then pass through the fourth chamber through the through portion of the third chamber.

* * * * *